United States Patent
Choudhury et al.

[11] Patent Number: 6,048,777
[45] Date of Patent: Apr. 11, 2000

[54] FABRICATION OF HIGH POWER SEMICONDUCTOR DEVICES WITH RESPECTIVE HEAT SINKS FOR INTEGRATION WITH PLANAR MICROSTRIP CIRCUITRY

[75] Inventors: Debabani Choudhury, Woodland Hills; James A. Foschaar, Thousand Oaks; Phillip H. Lawyer, Thousand Oaks; David B. Rensch, Thousand Oaks, all of Calif.

[73] Assignee: Hughes Electronics Corporation, El Segundo, Calif.

[21] Appl. No.: 08/992,882

[22] Filed: Dec. 18, 1997

[51] Int. Cl.$^7$ ................................................. H01L 21/265
[52] U.S. Cl. .............................. 438/460; 438/171; 257/6; 257/625
[58] Field of Search .................... 257/6, 498, 625; 438/171, 667, 740, 741, 460

[56] References Cited

U.S. PATENT DOCUMENTS

| | | | |
|---|---|---|---|
| 3,728,236 | 4/1973 | Weller et al. | 438/460 |
| 3,820,236 | 6/1974 | Haitz | 438/460 |
| 3,973,320 | 8/1976 | Greco et al. | 438/464 |
| 4,698,901 | 10/1987 | Davies et al. | 438/114 |
| 5,130,771 | 7/1992 | Burnham et al. | 257/625 |
| 5,250,815 | 10/1993 | Battersby et al. | 257/6 |
| 5,710,068 | 1/1998 | Hill | 438/171 |

OTHER PUBLICATIONS

Crowley et al., "140 Ghz indium phosphide Gunn diode", *Electronics Letters*, Vol. 30, No. 6, Mar. 17, 1994, pp. 499–500.

K. Okaniwa et al., "A Novel FET Structure of Buried Plated Heat Sink for Superior High Performance GaAs MMICs", *IEEE GaAs IC Symposium*, 1990, pp. 233–236.

J.S. Kofol et al., "A Backside Via Process for Thermal Resistance Improvement Demonstrated Using GaAs HBTs", *IEEE GaAs IC Symposium*, 1992, pp. 267–270.

*Primary Examiner*—Benjamin Utech
*Assistant Examiner*—Duy-Vu Deo
*Attorney, Agent, or Firm*—V. D. Duraiswamy; M. W. Sales

[57] ABSTRACT

A low cost highly integrated method of fabricating a heat sink on the backside of a power semiconductor device maintains device performance, improves thermal transfer, and enables reliable planar connections without having to dice the wafer or package the discrete device-heat sink assembly. An etch stop layer is formed between the wafer and the frontside power devices to protect them during backside processing and to reduce the contact resistance between the device and its heat sink. The heat sinks are formed by thinning, patterning and then plating the wafer in such a manner that the devices can be released without dicing. The heat sinks are preferably oversized so that a vacuum tool can grasp the heat sink from above without damaging the device and then compression bond the heat sink onto a planar microstrip circuit assembly, which is designed and packaged to facilitate easy replacement of failed devices.

22 Claims, 6 Drawing Sheets

FABRICATION OF HIGH POWER SEMICONDUCTOR DEVICES WITH RESPECTIVE HEAT SINKS FOR INTEGRATION WITH PLANAR MICROSTRIP CIRCUITRY

BACKGROUND OF THE INVENTION

1. Field of the Invention

This invention relates to the fabrication of heat sinks for high power semiconductor devices and to the integration of the devices with planar microstrip circuitry.

2. Description of the Related Art

High power semiconductor devices such as Gunn diodes, heterojunction bipolar transistors (HBTs), p-channel high electron mobility transistors (p-HEMTs) and field effect transistors (FETs) generate a lot of heat during operation that must be removed to maintain the device's performance and prevent damage. The standard approach is to provide a passive heat sink that draws heat away from the device and dissipates it in the ambient environment. The preferred heat sink and method of fabrication would be easy to manufacture, low cost, and highly integratable, provide adequate thermal transfer performance, and enable reliable electrical connections without degrading the device's electrical performance. To achieve these goals, the heat sink must be very close to the device's active layers, the wafer should not require dicing to form the discrete devices, the discrete devices should not be individually packaged, and the device should be mounted in such a manner that planar electrical connections can be used.

Crowley et al., "140 Ghz indium phosphide Gunn diode" Electronics Letters, Mar. 17, 1994, vol. 30, No. 6, pp. 499–500 discloses a method of fabricating and packaging a Gunn diode with an integral heat sink. As shown in FIG. 1 of Crowley et al, buffer and active layers are grown on an InP substrate. The wafer is thinned and metallised on both sides to form a top metal contact on the thinned substrate and an integral heat sink on the active layer. A $FeCl_3$ light sensitive etchant is used to define and release the discrete devices without dicing. The formation of the heat sink directly on the diode's active layers generally improves heat transfer. However, the parasitic series resistance associated with the substrate and buffer layer tends to degrade the electrical performance of the diode.

As shown in FIG. 2 of Crowley et al., non-planar assemblies use discrete Gunn diodes, which are compression bonded to individual threaded copper studs. A quartz ring is formed around the Gunn diode and gold ribbons in the shape of a cross are compression bonded to the top contact of the Gunn diode and the quartz ring. A copper lid is used to form a hermetic enclosure for the diode and extend the top contact. The individual packaged Gunn diodes are screwed into a circuit board or block and the elevated top contact is wire bonded to the circuitry on the board. Furthermore, if the Gunn diode should fail, a technician must unscrew and replace the stud. Discrete packaging is expensive and limits integration.

K. Okaniwa et al., "A Novel FET Structure of Buried Plated Heat Sink for Superior High Performance GaAs MMICs" IEEE GaAs IC Symposium, 1990, pp. 233–236 discloses a method of fabricating a parallel FET structure that is connected to a buried heat sink to improve output power and efficiency. As shown in FIGS. 1 and 2a–2e of K. Okaniwa et al, FET electrodes are formed on the frontside of a wafer using conventional processing. Thereafter, via holes from the FET sources are etched down to a depth of 30 microns, the wafer is thinned and chemically etched to form a single tub that exposes the bottoms of multiple via holes. The tub is filled with a plated gold metal to a) short all the source electrodes so that the FETs are connected in parallel to form a single power FET and b) to provide a heat sink. This process is highly integrated, in fact the power FET is directly integrated with other circuitry on the wafer. The process does not require dicing and facilitates planar connections to the other circuitry. However, this process does not produce discrete devices with integrated heat sinks, and further the 30 micron substrate reduces thermal transfer efficiency and increases conduction loss of the microstrip.

J. S. Kofol et al., "A Backside Via Process for Thermal Resistance Improvement Demonstrated Using GaAs HBTs", IEEE GaAs IC Symposium, pp. 267–270, 1992 discloses a method for reducing the operating temperature of HBTs while maintaining the compact device layout needed for high frequency operation. The top side of the wafer is processed to form the HBTs. The conventional process is modified in two ways to accommodate the backside thermal via (BTV) process. First, additional epitaxial layers are formed underneath the usual HBT layers to 1) provide selective etch stopping during backside etching, 2) separate topside circuit elements from BTV metal for AC isolation and 3) DC isolate buried subcollector layers from BTV ground. Second, a via hole is etched to provide an optional through-chip ground. The backside of the wafer is thinned to 100 microns and then etched leaving a 5 micron membrane of wafer material beneath the HBT. The tub is plated with gold to form the heat sink.

Although Kofol's heat sink is "close" to the HBT, the process has several drawbacks. First the additional epitaxial layers increase the parasitic series resistance, which degrades the HBT's performance. Second, the wafer must be diced to release the individual devices. This is time consuming, expensive, and may damage the HBTs. Lastly, the device cannot be grabbed topside because of the circuitry. As a result, the HBT's heat sink cannot be compression bonded but must be epoxy bonded when it is mounted on a circuit board, which reduces heat dissipation.

SUMMARY OF THE INVENTION

In view of the above problems, the present invention provides a low cost highly integrated method of fabricating a heat sink on the backside of a power semiconductor device that maintains device performance and improves thermal transfer without having to dice the wafer or package the discrete device-heat sink assembly.

This is accomplished by first forming an etch stop layer on a semiconductor wafer. The wafer is processed to form an array of power semiconductor devices such as Gunn diodes, HBTs, p-HEMTs or FETs on the etch stop layer and then waxed face down onto a carrier (e.g. a silicon substrate). The wafer's back surface is patterned to form a web of wafer material that defines an array of tubs that expose portions of the etch stop layer on back sides of the respective devices that are wider than the devices. The wafer is preferably thinned to approximately 2 mils and then patterned using first a shadow and then a tub etching process. The etch stop layer protects the devices during heat sink fabrication and can also reduce the contact resistance if it is heavily doped. Thereafter, heat sinks are fabricated on the exposed portions of the etch stop layer in the respective tubs and spaced inward from their walls. The heat sinks are preferably formed by sputtering a plating plate over the wafer, patterning a photoresist that exposes portions of the plating plane in the bottom of the tubs, and then plating a relatively thick gold composite layer onto the exposed plating plane. The power semiconductor devices and their integrated heat sinks are released from the web and carrier by etching the portions of the etch stop layer that lie between the heat sinks and the tub walls and then dissolving the wax bonding agent.

In the preferred embodiment, the heat sinks are oversized so that a vacuum tool can grasp the heat sink from above without damaging the device and then compression bond the heat sink onto a planar microstrip circuit assembly. The assembly includes a planar microstrip circuit formed on an insulator layer that is supported by a circuit block, which also serves as the microstrip circuit's RF ground. The devices are compression bonded to respective end blocks that are slideably engaged with the circuit block to enable alignment of the semiconductor device with the transmission line circuit. Accurate alignment assures minimum ribbon bond lengths to connect the device and the circuit. The entire assembly is then packaged as an integrated unit that can be opened to align and rebond a different device should the current one fail.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a low cost highly integrated method of fabricating a heat sink on the backside of a power semiconductor device that maintains device performance, improves thermal transfer, and enables reliable planar connections without having to dice the wafer or package the discrete device-heat sink assembly. The heat sinks are oversized so that a vacuum tool can grasp the heat sink from above without damaging the device and then compression bond the heat sink onto a planar microstrip circuit assembly, which is designed and packaged to facilitate easy replacement of failed devices.

Figure 1:
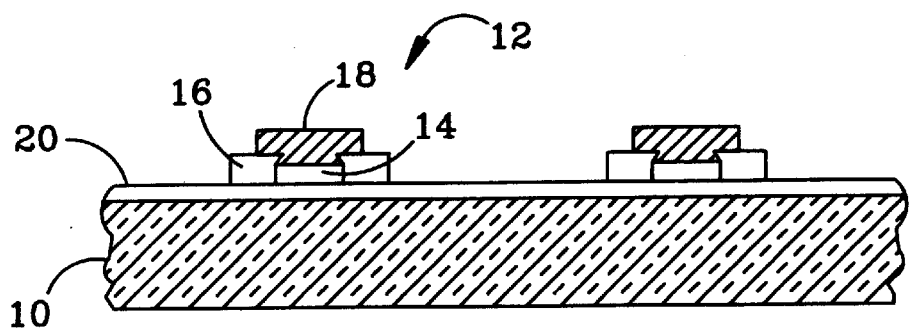
FIG. 1 is a sectional view of a pair of Gunn diodes on a wafer after front side processing.

FIG. 1 depicts a portion of a wafer 10 after front side processing to form an array of high power semiconductor devices 12, shown here and described throughout as Gunn diodes, which are commonly used to provide a negative resistance element to stabilize an oscillator used in planar microwave circuitry at millimeter wave frequencies. There is an unmet demand for low-cost highly integrated Gunn diodes. However, the described process is also applicable to HBTs, p-HEMTs, FETs and other power devices.

The Gunn diodes are formed using conventional front side processing techniques with one important modification. The diodes 12 suitably comprise N-type InP epilayers 14 fabricated on the semi-insulating InP wafer 10 between polyimide spacers 16 with a top metal contact 18. The epilayers and top metal are suitably two and ten microns thick, respectively. The conventional processing is modified by first depositing a thin etch stop layer 20 on the front side of wafer 10. At a minimum, the etch stop layer protects the diodes during the chemical etching of the InP wafer. With proper selection, suitably 0.2 microns of InGaAs, the etch stop layer has a smaller bandgap than the InP epilayers and, hence, reduces the contact resistance between the diode 12 and the heat sink, which functions as one of the electrical contacts to the diode.

Figure 2:
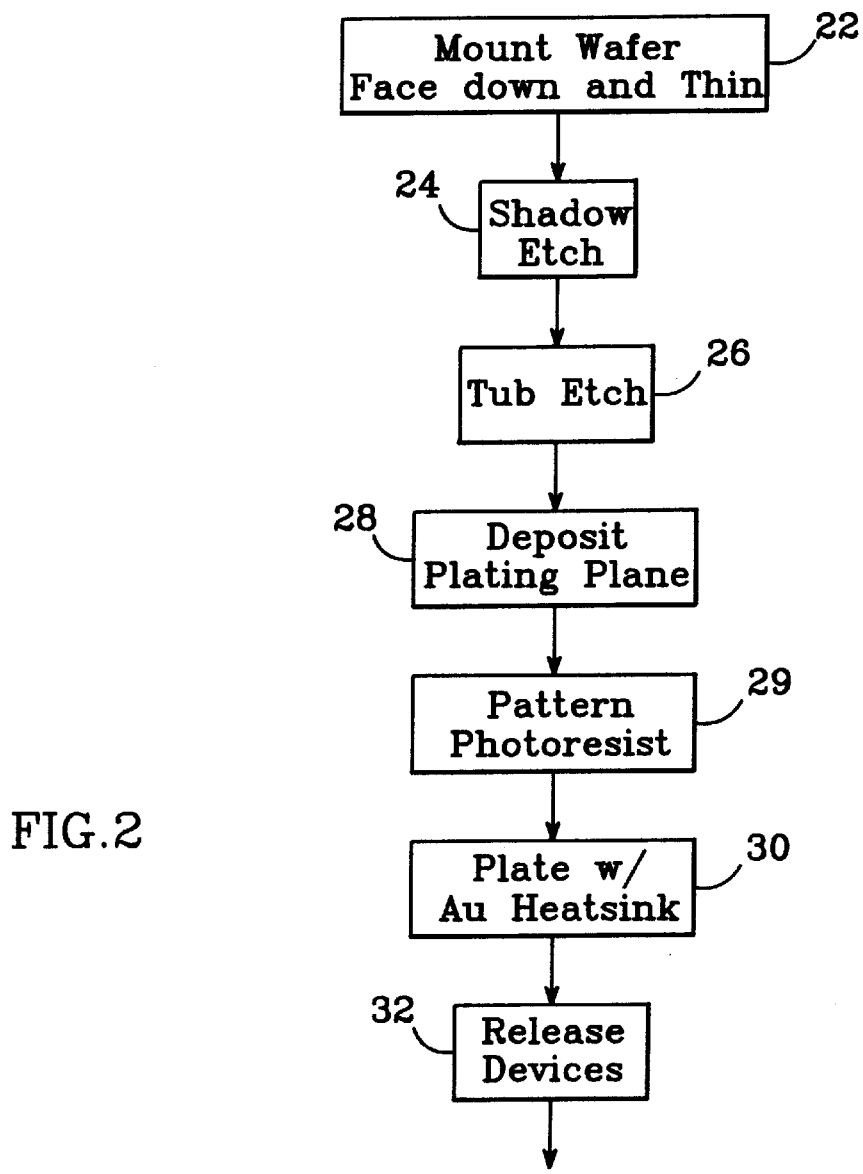
FIG. 2 is a flowchart illustrating the preferred method of fabricating a heat sink on the backside of the Gunn diodes shown in FIG. 1.

The wafer 10 undergoes backside processing as described in FIG. 2 to form heat sinks on the backside of each Gunn diode 12 and release the diode assemblies without dicing the wafer. The wafer is waxed face down onto a carrier (e.g. silicon substrate) to permit the InP wafer to be mechanically thinned for further backside processing (step 22). The wafer is patterned to form a web of wafer material that defines an array of tubs that expose portions of the etch stop layer on the backside of the respective Gunn diodes that are wider than the diodes. In the preferred embodiment, the wafer is patterned using a shadow etch (step 24) and a tub etch (step 26). The wafer must be thick enough to provide mechanical support and avoid stressing the Gunn diodes. Thus, an acid etch is required to achieve the preferred tub profile in the thick wafer. Because an acid etch would consume a resist mask, a metal mask is used instead. The photoresist and metal layers used to form the metal mask block the ability to see the Gunn diodes when using infrared alignment techniques and therefore prevent proper mask alignment. Thus, the InP carrier is shadow etched (step 24) to form registration marks for aligning the metal mask used in the tub etch (step 26). Other known or newly developed techniques may be used to pattern the backside of the wafer without departing from the scope of the invention.

Once patterned, metal heat sinks are formed on the exposed portions of the etch stop layer in the respective tubs and spaced inward from their walls. In the preferred embodiment, the backside of the wafer is sputtered to form a thin plating plane (step 28), patterned with a photoresist to expose portions of the plating plate in the bottoms of the tubs on the backsides of the respective Gunn diodes (step 29), and then plated (step 30) to form thick metallizations on the exposed portions of the plating plane in the tubs that form the heat sinks. The two-step plating process is less expensive and better able to form the thick heat sink than etching or lift-off techniques.

The discrete diode assemblies (Gunn diode with an integrated heat sink) are released from the web and carrier by etching through the exposed portions of the plating plane and underlying etch stop layer that lie between the heat sinks and the tubs' walls and dissolving the bonding agent (step 32). In the preferred embodiment, the heat sinks are oversized so that they can be grasped from above by a vacuum tool without damaging the Gunn diode and then compression bonded to a primary heat sink on a circuit board.

A specific example of the backside processing technique described in FIG. 2 is illustrated in detail in FIGS. 3a through 3i. As shown in FIG. 2a, the front surface of wafer 10 has been coated with Novalak, baked at 165° for 5 minutes, and mounted on a Si substrate 34 using a wax bonding agent 36. Once mounted, the backside 38 of wafer 10 is lapped and polished to approximately 2 mils (51 microns).

Figure 3A:
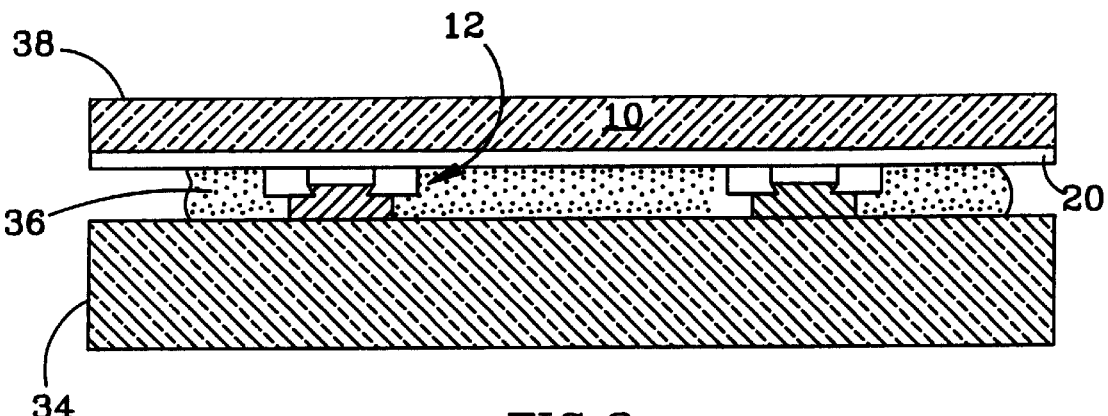
FIGS. 3a through 3i are sectional views illustrating the processing of the wafer shown in FIG. 1 in accordance with the method illustrated in FIG. 2 to form the heat sinks.
Figure 3B:
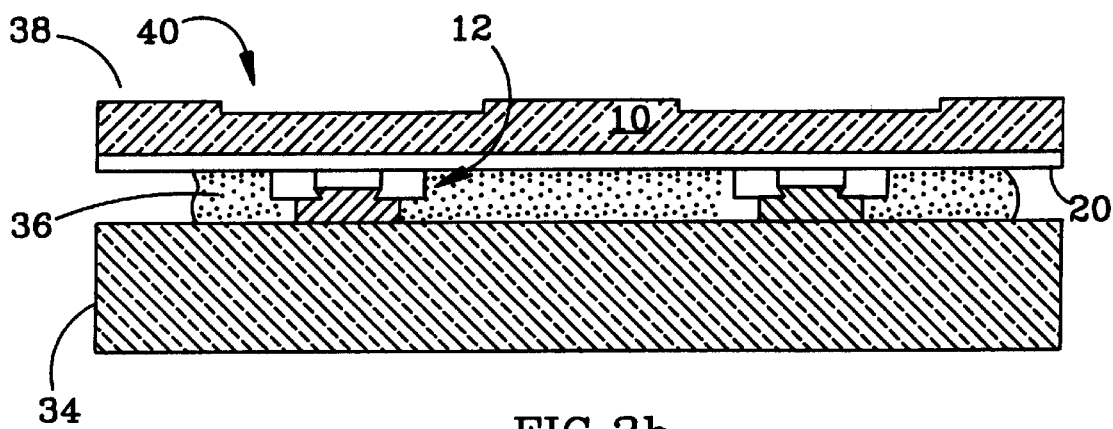

As shown in FIG. 3b, the backside 38 of wafer 10 has been shadow etched to form registration marks 40, which in this case are shallow recesses that define the desired tub size. Specifically, the backside 38 is cleaned using Trichloro Ethylene (TCE) at 2000 rpm for 30 seconds and then (Isopropyl alcohol) IPA at 2000 rpm for 15 seconds. Once cleaned, a 1350J photoresist is spun onto wafer 10 at 4000 rpm for 30 seconds and baked at 90° C. for 30 minutes. An IR aligner is used to align a mask to the Gunn diodes. The photoresist is exposed for 6 seconds and then din 1:1 devin 1:1 developer for 1 minute. The exposed wafer is ion milled in Argon for 5 minutes to a depth of a few thousand angstroms and then sputter etched in $O_2$ for 2 seconds. Acetone is used to remove the photoresist.

Figure 3C:
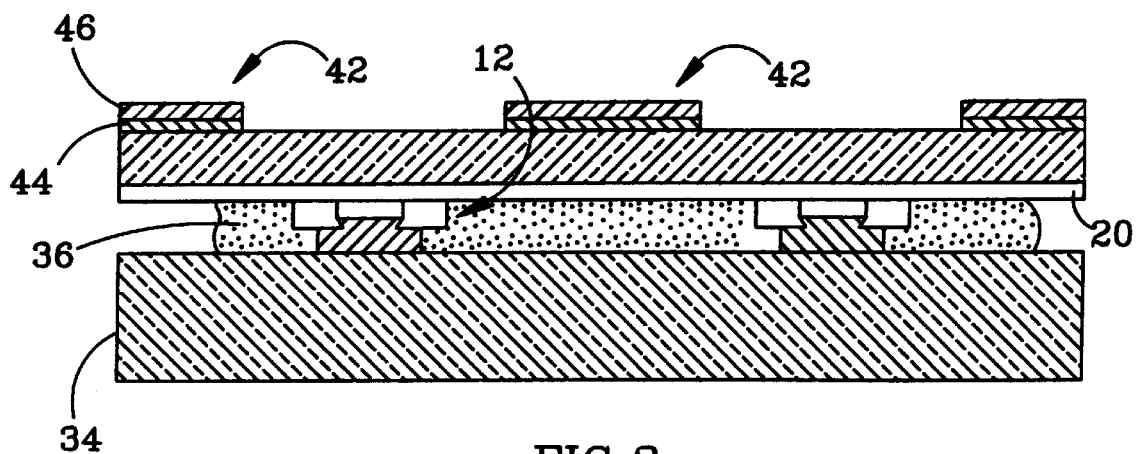

As shown in FIG. 3c, a metal mask 42 has been formed for the subsequent tub etch. To form the mask, the wafer surface is cleaned by spinning the wafer in IPA for 30 seconds and performing a chromium etch for 15 minutes. Once cleaned, a titanium-gold layer 44 (Ti(250 Å)/Au(1 $\mu$m) is sputter deposited on the wafer. Thereafter, a photoresist 46 is patterned to etch layer 44. Specifically, a 1350J photoresist is spun on to the wafer at 4000 rpm for 30 seconds, baked 90° for 30 minutes, exposed with the same tub mask used in the shadow etch for 4 seconds, developed in 1:1 AZ developer, and back sputter etched with Argon.

Figure 3D:
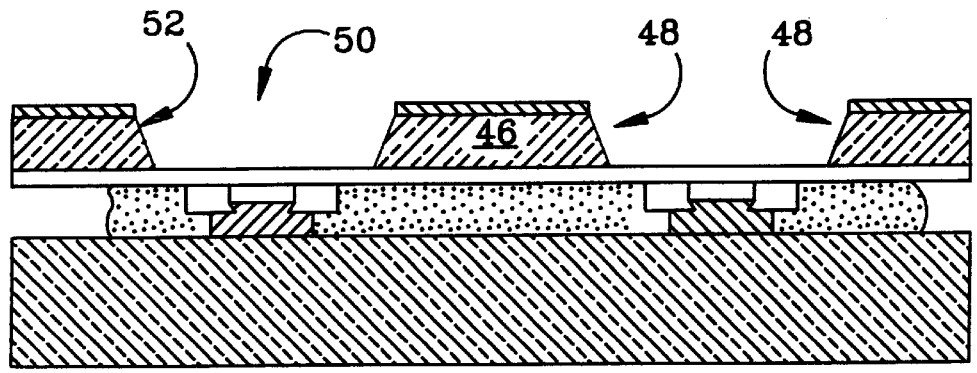

As shown in FIG. 3d, the wafer has been etched to form a web 48 of wafer material that defines an array of tubs 50 that expose portions of the etch stop layer 20 on the back sides of the respective Gunn diodes 12 where the tubs are wider than the diodes. The first step in the tub etch is to remove photoresist 46 with acetone. Thereafter, the wafer material is acid etched with 3:2 HCL:$H_3PO_4$ for about 10 minutes until the etch stop layer is reached. This can be determined in two ways. First, the etch rate of InGaAs is much slower than InP. Thus, a dramatic change in etch rates is a good indicator for stopping. Alternately, the color seen through the backside of the wafer will change suddenly when the InP wafer material disappears. As shown, the acid etch is a preferential etch in which the walls 52 of the tubs have a gradual taper from top to bottom, which helps maintain continuity of the electroplating membrane.

Figure 3E:
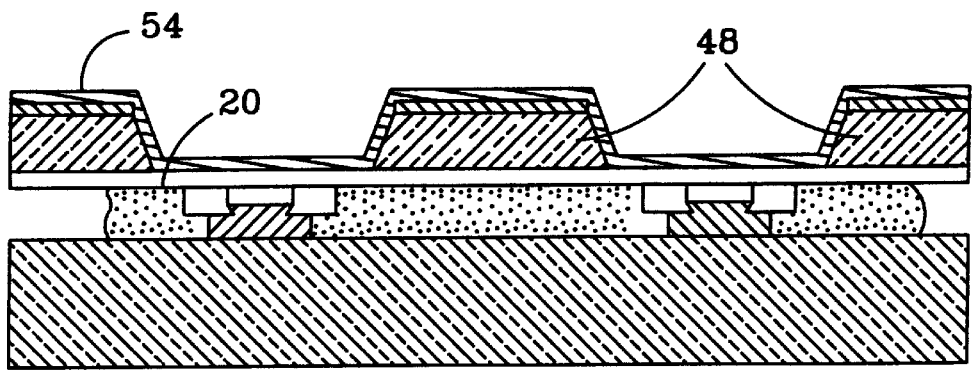

As shown in FIG. 3e, the wafer has been sputtered to form a plating plane 54 on the exposed portions of the etch stop layer 20 on the back sides of the respective Gunn diodes and on web 48. The surface is prepared by cleaning it in TCE at 2000 rpm for 30 seconds and IPA at 2000 rpm for 15 seconds and then etching in $NH_4OH:H_2O$ (15:1) for 30 seconds. A metal layer of 250 Å of Ti, 500 Å of Pt and 3000 Å of gold is sputter deposited to form plating plane 54.

Figure 3F:
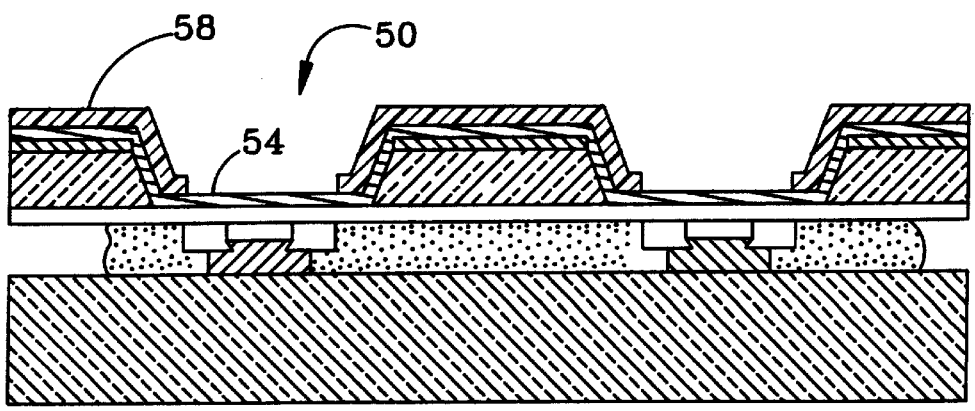
Figure 3G:
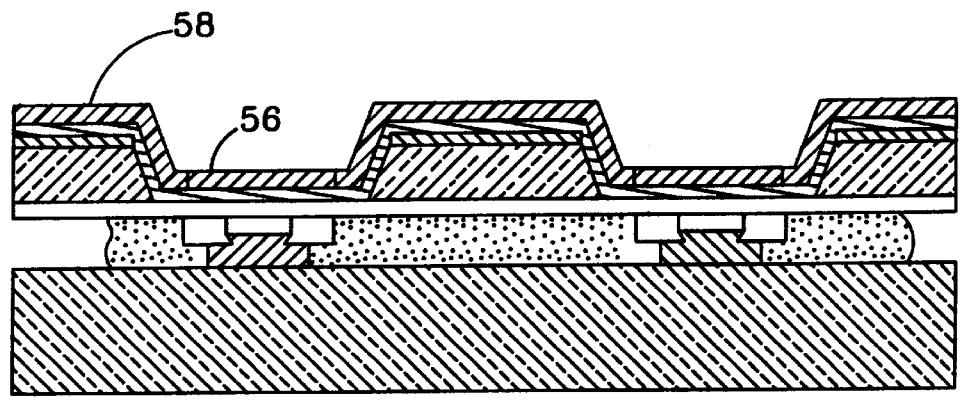

Heat sinks are formed by patterning a photoresist 58 as shown in FIG. 3f that exposes portions of plating plane 54 at the bottom of tubs 50 that are spaced inward from the walls of the tub and then plating the exposed portions of plating plane 54 with a Au composite as shown in FIG. 3g. Photoresist 58 is patterned by first brushing the resist over the wafer to wet the bottom of tubs 50 to prevent bubbles from forming. A large drop of resist is placed on the wafer, spun at 2000 rpm for 30 seconds, baked at 90° C. for 60 minutes, exposed with a heat sink mask having openings that are smaller than and registered to the tub mask's openings, and then developed for 2 minutes with AZ 421K developer. The wafer is then re-exposed with the same heat sink mask and developed for another 2 minutes to form patterned photoresist 58, which exposes portions of plating plane 54 that are spaced from the respective tub's walls.

To form heat sinks 56, the exposed Au surface of the plating plane is cleaned by treating it with surfactant and etching in $NH_4OH:H_2O$ (15:1) for 30 seconds. The backside of the substrate is painted with black wax. Once prepared, the wafer is plated in a Au-bath to form 8 $\mu$m of soft Au, 2 $\mu$m of hard Au and finally 10 $\mu$m of soft gold for a 20 $\mu$m heat sink. The soft layers allow the heat sink to be compression bonded to another surface. The hard layer provides a barrier to absorb the force of compression bonding to protect the Gunn diodes. The parameters of the Au-bath are suitably: pH equals 6.8 (soft Au) and 6.6 (hard Au), temperature=42° C., electrical current equals 10 mA (soft Au) and 5 mA (hard Au) with a plating rate of 1666 Å/min (soft Au) and 333 Å/min (hard Au).

Figure 3H:
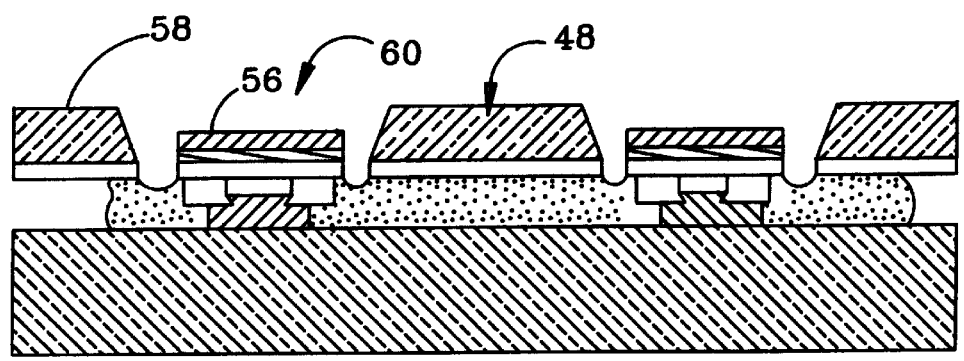
Figure 3I:
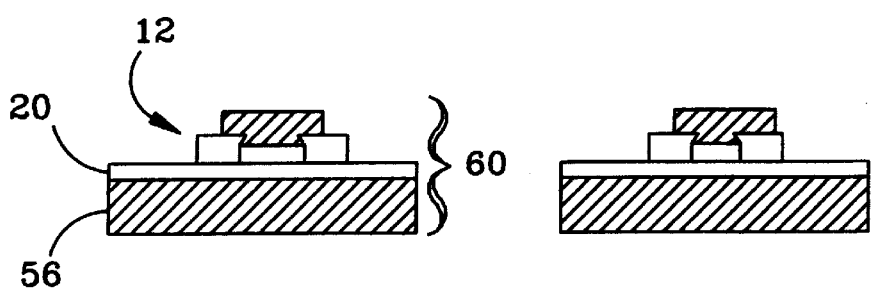

Once the diode assemblies 60 have been formed they must be released from web 48 and carrier 34. The black wax and resist 58 are cleaned with TCE and acetone, respectively. Once cleaned, the metal is sputter etched to remove the exposed portions of plating plane 54 that lie between heat sinks 56 and the tubs' walls 52 as well as the etch stop layer 20 as shown in FIG. 3h. The etch continues until the wax bonding agent 36 is seen. The wafer is then treated with TCE to remove wax 36 and release diode assemblies 60 as shown in FIG. 3i. This is repeated 3–4 times to remove all the wax.

Figure 4:
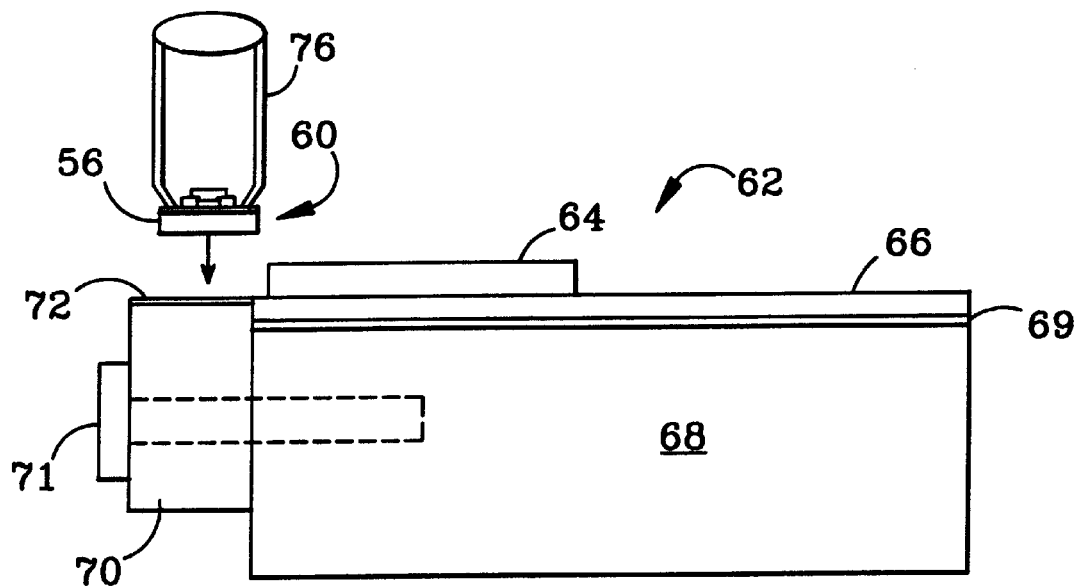
FIG. 4 is a side view illustrating the method of compression bonding the diode assembly to the planar microstrip circuit assembly.

FIG. 4 illustrates the step of compression bonding the diode assembly 60 to a planar microstrip circuit assembly 62. A planar microstrip circuit 64 such as a Gunn oscillator is formed using conventional techniques on an insulator layer 66 such as a duroid board. A copper circuit block 68 enhances the stiffness of the duroid board which is attached to the block with an adhesive strip 69 and provides the RF for the microstrip circuit. At least one copper end block 70 is attached with a screw 71 to one end of circuit block 68 so that its surface 72, which is coated with a soft gold layer, is approximately planar with the surface of the duroid board.

A vacuum tipped pickup tool 76 grasps heat sink 56 and thermionic compression bonds it to the gold surface of the end block at elevated temperatures. For example, a 150 gm bond load at a tip temperature of 180° C. with 8 W ultrasonic for 100 mS was sufficient to form the Au-to-Au compression bond between the heat sink and the end block. The heat sink functions to remove heat from the Gunn diode and transfer it to the end block, which serves as the primary heat sink in this assembly. Compression bonding avoids the insulator layer associated with epoxy bonding, and hence exhibits better thermal transfer characteristics.

Figure 5:
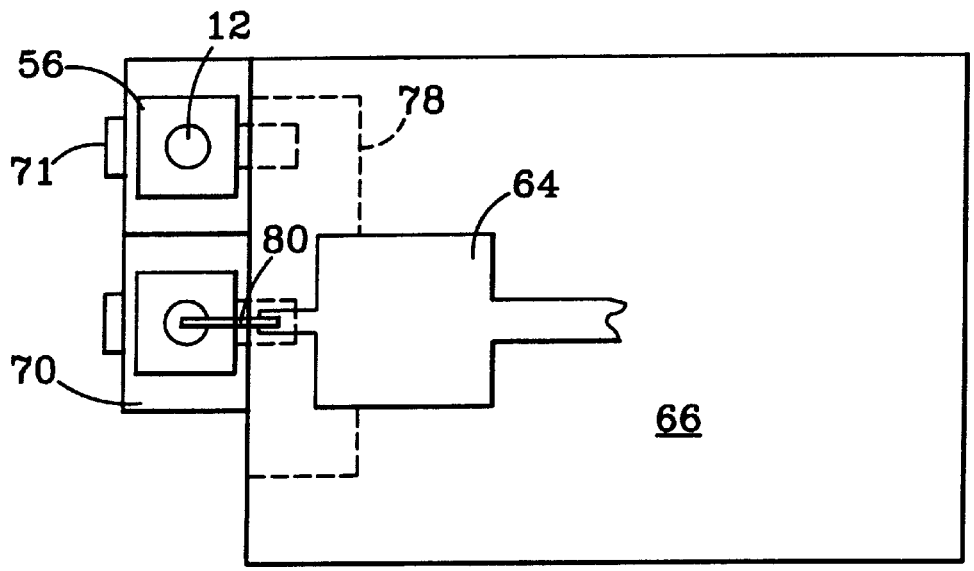
FIG. 5 is a top view of the planar microstrip circuit assembly particularly illustrating the redundant diode assembly capabilities.

As seen in FIG. 5, the assembly preferably has two (or more) end blocks 70 with compression bonded diode assemblies 60 that are slideably engaged with a slot 78 in the end of circuit block 68. One of the blocks is aligned with microstrip circuit 64 and its screw 71 is tightened to hold it in place. That block's Gunn diode is then rebonded with a 2 mil (50 micron) wide piece of gold ribbon 80 to the microstrip circuit. This interconnection is approximately planar, and hence more reliable then previous non-planar techniques associated with the discretely package lugs.

Figure 6:
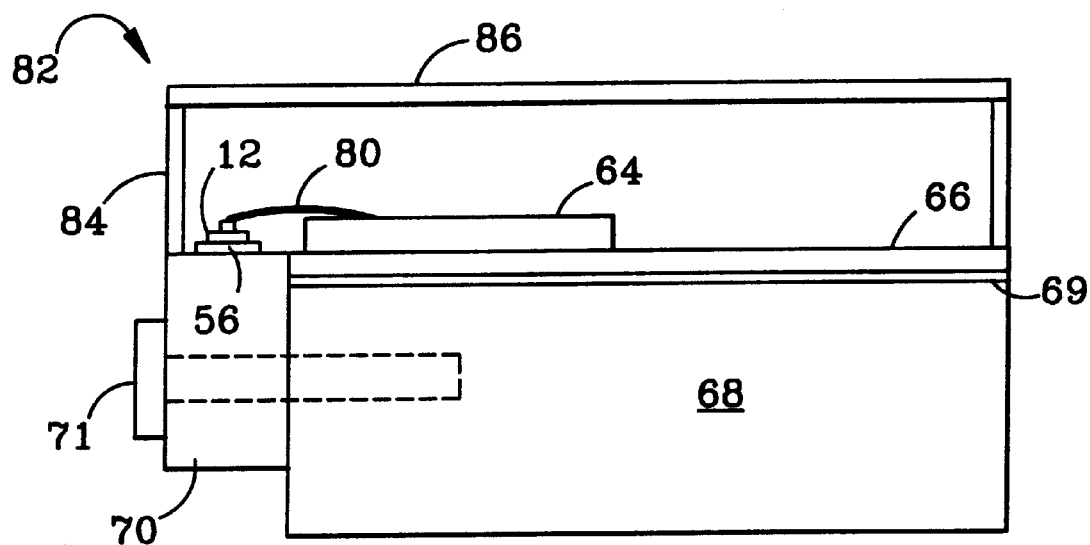
FIG. 6 is a sectional view of the packaged planar microstrip circuit assembly.

As shown in FIG. 6, the entire assembly is packaged in an integrated package 82 that includes a ring 84, preferably quartz, around the entire assembly and a removable lid 86 that provides physical as well as environmental protection. With this type of integrated package, should the rebonded Gunn diode fail a technician can remove the lid 86 and rebond 80, loosen the screw 71, slide the end block 70 out of the way and retighten its screw. The other end block is then moved into place, tightened down and rebonded to the microstrip circuit, and the lid is replaced. This is much easier and cost efficient then replacing discrete lugs every time a diode fails and facilitates a much higher level of integration.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of fabricating heat sinks on the backsides of an array of individual power semiconductor devices and of separating said array of individual devices and their respective heat sinks without cutting or dicing, comprising:

providing a semiconductor wafer;

forming an etch stop layer on the semiconductor wafer;

frontside processing the wafer to form an array of power semiconductor devices on the etch stop layer;

using a bonding agent to mount the wafer face down onto a carrier so that the wafer's back surface is exposed;

patterning the wafer's back surface to form a web of wafer material that defines an array of tubs that expose portions of the etch stop layer on the backsides of the respective power semiconductor devices that are wider than said devices;

forming heat sinks on said exposed portions of said etch stop layer in the respective tubs that are spaced inward from their walls;

etching through the exposed portions of the etch stop layer that lie between said heat sinks and the walls of the tubs; and chemically removing the bonding agent to release the power semiconductor devices with their respective integrated heat sinks from said web and said carrier, said method enabling said power semiconductor devices and their respective integrated heat sinks to be separated without sawing or dicing.

2. The method of claim 1, wherein said etch stop layer protects the power semiconductor devices during the fabrication of said heat sinks and reduces the contact resistance between each said device and its heat sink.

3. The method of claim 2, wherein the etch stop layer comprises indium-gallium-arsenide (InGaAs).

4. The method of claim 1, wherein said power semiconductor device comprises a Gunn diode.

5. The method of claim 1, wherein said bonding agent comprises wax.

6. The method of claim 1, wherein said wafer is thick enough to mechanically support said devices, said wafer being patterned by:

shadow etching the wafer's back surface to provide registration marks above the respective power semiconductor devices;

depositing a metal layer on the wafer's back surface;

forming a tub photoresist layer on said metal layer;

using a tub mask, which is aligned to said registration marks and has openings that are wider than said devices, to pattern the tub photoresist layer to expose portions of the metal layer;

etching the exposed portions of the metal layer to define a metal mask; and using the metal mask to acid etch said wafer to create the tubs with tapered walls that are spaced from said devices.

7. The method of claim 6, wherein the wafer is shadow etched by:

forming a shadow photoresist layer on said wafer;

aligning a shadow mask on said power semiconductor devices;

exposing and developing said photoresist layer; and etching portions of said wafer exposed by said shadow mask to form said registration marks.

8. The method of claim 1, wherein the heat sinks are formed by:

sputtering the wafer's back surface to form a plating plane on the exposed portions of the etch stop layer in said tubs on the back sides of the respective devices;

forming a heat sink photoresist layer on said plating plane;

using a heat sink mask having openings that are smaller than and registered to the tubs to pattern the heat sink photoresist layer and expose portions of said plating plane that are spaced inward from the respective tub's walls; and plating metal onto the exposed portions of said plating plane on the back sides of the respective devices and spaced inward from the walls of their respective tubs.

9. The method of claim 8, wherein the heat sink photoresist layer is formed by:

painting photoresist material onto the wafer to wet the exposed portion of the plating plane at the bottom of the tubs to prevent the formation of air bubbles; and spinning photoresist material onto the wafer over the painted on photoresist material.

10. The method of claim 8, wherein the wafer is sputtered with titanium-platinum-gold (Ti/Pt/Au) to form the plating plane.

11. The method of claim 10, wherein the Ti/Pt/Au plating plane is plated with a composite gold layer so that said heat sink can be compression bonded.

12. The method of claim 7, wherein said heat sink masks' openings and thus said heat sinks are wider than said devices to improve thermal transfer and enable a vacuum tool to grasp the heat sink from above without damaging the device and then compression bond the heat sink to another surface.

13. A method of fabricating heat sinks on the backsides of an array of individual power semiconductor devices and of separating said array of individual devices and their respective heat sinks without cutting or dicing, comprising:

providing a semiconductor wafer;

forming an etch stop layer the semiconductor wafer;

frontside processing the wafer to form an array of power semiconductor devices on the etch stop layer;

using a bonding agent to mount the wafer face down onto a carrier so that the wafer's back surface is exposed;

thinning the wafer;

shadow etching the wafer's back surface to provide registration marks above the respective power semiconductor devices on the wafer's front surface;

tub etching the wafer's back surface to the etch stop layer in accordance with the registration marks thereby creating a web of wafer material that defines an array of tubs that expose portions of the etch stop layer on the backsides of the respective devices that are wider than the diodes;

sputtering the wafer's back surface to form a plating plane on the exposed portions of the etch stop layer on the respective power semiconductor devices;

patterning a heat sink photoresist to expose portions of the plating plane on the back sides of the respective power semiconductor devices that are spaced inward from the walls of the tubs;

plating metal onto the exposed portions of the plating plane to form heat sinks on the back sides of the respective devices;

removing the heat sink photoresist;

etching through the exposed portions of the plating plane that lie between said heat sinks and the tubs' walls and through the underlying etch stop layer; and chemically removing the bonding agent to release the power semiconductor devices with their respective integrated heat sinks from the web and said carrier, said method enabling said power semiconductor devices and their respective integrated heat sinks to be separated without sawing or dicing.

14. The method of claim 13, wherein said etch stop layer protects the power semiconductor devices during the fabrication of said heat sinks and reduces the contact resistance between each said device and its heat sink.

15. The method of claim 13, wherein the wafer is shadow etched by:

forming a shadow photoresist layer on said wafer;

aligning a shadow mask on said power semiconductor devices;

exposing and developing said photoresist layer; and etching a thin layer of said wafer exposed by said shadow mask to form said registration marks.

16. The method of claim 15, wherein the wafer is tub etched by:

depositing a metal layer on the wafer's back surface;

forming a tub photoresist layer on said metal layer;

using a tub mask, which is aligned to said registration marks and has openings that are wider than said power semiconductor devices, to pattern the tub photoresist layer to expose portions of the metal layer;

etching the exposed portions of the metal layer to define a metal mask; and using the metal mask to acid etch said wafer to create the tubs with tapered walls that are spaced from said power semiconductor devices.

17. The method of claim 16, wherein the heat sink photoresist is patterned by:

forming a heat sink photoresist layer on said plating plane; and using a heat sink mask having openings that are smaller than and registered to the tub mask's openings to pattern the heat sink photoresist layer and expose portions of said etch stop layer that are spaced inward from the respective tub's walls.

18. The method of claim 17, wherein the heat sink photoresist layer is formed by:

painting photoresist material onto the wafer to wet the exposed portion of the plating plane at the bottom of the tubs to prevent the formation of air bubbles; and spinning photoresist material onto the wafer.

19. The method of claim 18, wherein said heat sink mask's openings and thus said heat sinks are wider than said devices to improve thermal transfer and enable a vacuum tool to grasp the heat sink from above without damaging the power semiconductor device and then compression bond the heat sink to another surface.

20. The method of claim 5, wherein said step of chemically removing the bonding agent is accomplished using trichloro ethylene (TCE).

21. The method of claim 13, wherein said bonding agent comprises wax and said step of chemically removing the bonding agent is accomplished using trichloro ethylene (TCE).

22. The method of claim 13, wherein said power semiconductor devices are Gunn diodes.

* * * * *